United States Patent [19]
Cheng

[11] Patent Number: 5,980,186
[45] Date of Patent: Nov. 9, 1999

[54] FORK COVER FOR VERTICAL FURNACE

[75] Inventor: Wei Hua Cheng, Singapore, Singapore

[73] Assignee: Chartered Semiconductor Manufacturing Ltd., Singapore, Singapore

[21] Appl. No.: 08/721,666

[22] Filed: Sep. 27, 1996

[51] Int. Cl.⁶ ...................................................... B65G 1/00
[52] U.S. Cl. .......................... 414/416; 414/785; 414/937
[58] Field of Search .................................. 414/416, 331, 414/935, 937, 938, 785; 187/237

[56] References Cited

U.S. PATENT DOCUMENTS

| | | | |
|---|---|---|---|
| 2,690,271 | 9/1954 | Marietta | 414/785 X |
| 2,817,792 | 12/1957 | Chew | 414/785 X |
| 4,550,242 | 10/1985 | Uehara et al. | 414/937 X |
| 4,785,962 | 11/1988 | Toshima | 220/260 |
| 5,217,340 | 6/1993 | Harada et al. | 414/937 X |
| 5,221,176 | 6/1993 | Allen et al. | 414/937 X |
| 5,380,137 | 1/1995 | Wada | 414/172 |
| 5,382,128 | 1/1995 | Takahashi et al. | 414/937 X |
| 5,575,608 | 11/1996 | Yau et al. | 414/785 X |

*Primary Examiner*—David A. Bucci
*Attorney, Agent, or Firm*—George O. Saile; Rosemary L. S. Pike; Billy Knowles

[57] ABSTRACT

A semiconductor wafer carrier fork cover to prevent damage to prevent breakage of the semiconductor wafer carrier forks mounted on a robotic semiconductor wafer transfer system during preventative maintenance procedures is described. A semiconductor wafer carrier fork cover has a lower support unit. The lower support unit will fit onto the base of a robotic semiconductor wafer transfer system. An upper covering unit is integrally attached to the lower support unit and will shield the semiconductor wafer carrier forks during preventive maintenance procedures.

2 Claims, 3 Drawing Sheets

FIG. 1 – Prior Art

FORK COVER FOR VERTICAL FURNACE

BACKGROUND OF THE INVENTION

1. Field of the Invention

This invention relates to robotic semiconductor wafer transfer system used in the moving of semiconductor wafers between a wafer cassette to a wafer boat within a vertical furnace and more particularly and guards and shields to protect components of the semiconductor wafer transfer system during preventive maintenance procedures.

2. Description of Related Art

Referring to FIG. 1, a robotic wafer transfer system 5, similar to that described in U.S. Pat. No. 5,380,137 (Wada), will pick wafers W from a wafer cassette 15 and place them in a wafer boat 20. The wafer boat 20 is housed within a vertical oven (not shown). The vertical oven will be sealed and a step of the semiconductor process such as chemical vapor deposition will be performed on the semiconductor wafers. At the completion of the step of the process involving the vertical oven, the wafers W are removed from the wafer boat 20 and returned to the wafer cassette 15.

The semiconductor wafers W are supported on the semiconductor wafer carrier forks 10. These semiconductor wafer carrier forks 10 are manufactured of a ceramic and contain an electro-optical sensor. The design of the semiconductor wafer carrier forks 10 coupled with the electro-optical form a unit that is extremely fragile.

Preventive maintenance to repair or replace components of the vertical oven and robotic wafer transfer system and other machinery involved in the semiconductor process requires the disassembly of the subunits of the these systems. As the subunits are disassembled, parts such as screws, nuts, or bolts may dropped. If the work area is above the wafer carrier forks 10, they may be broken or damaged necessitating replacement.

U.S. Pat. No. 4,785,962 (Toshima) describes a slit valve for sealing a vacuum chamber within the semiconductor wafer process and shows a robotic transfer system for conveying semiconductor wafer to the vacuum chamber.

SUMMARY OF THE INVENTION

An object of this invention to prevent damage to a robotic semiconductor wafer transfer system and in particular to prevent breakage of the semiconductor wafer carrier forks during preventative maintenance procedures.

To accomplish this and other objects, a semiconductor wafer carrier fork cover has a lower support unit. The lower support unit will fit onto the base of a robotic semiconductor wafer transfer system.

An upper covering unit is integrally attached to the lower support unit and will shield the semiconductor wafer carrier forks during preventive maintenance procedures.

DETAILED DESCRIPTION OF THE INVENTION

Figure 1:
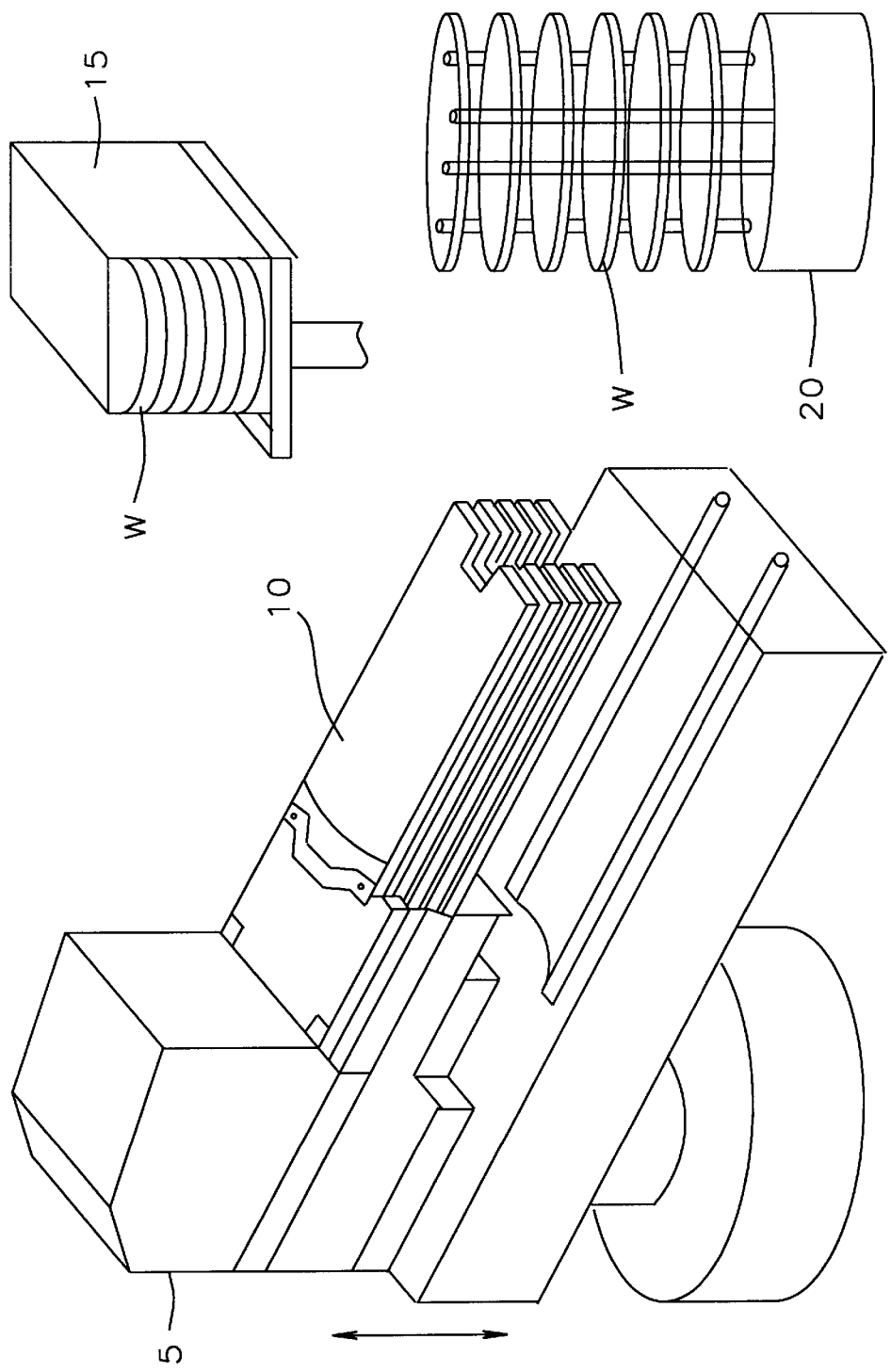
FIG. 1 is a perspective view of a wafer transfer device of prior art.
Figure 2:
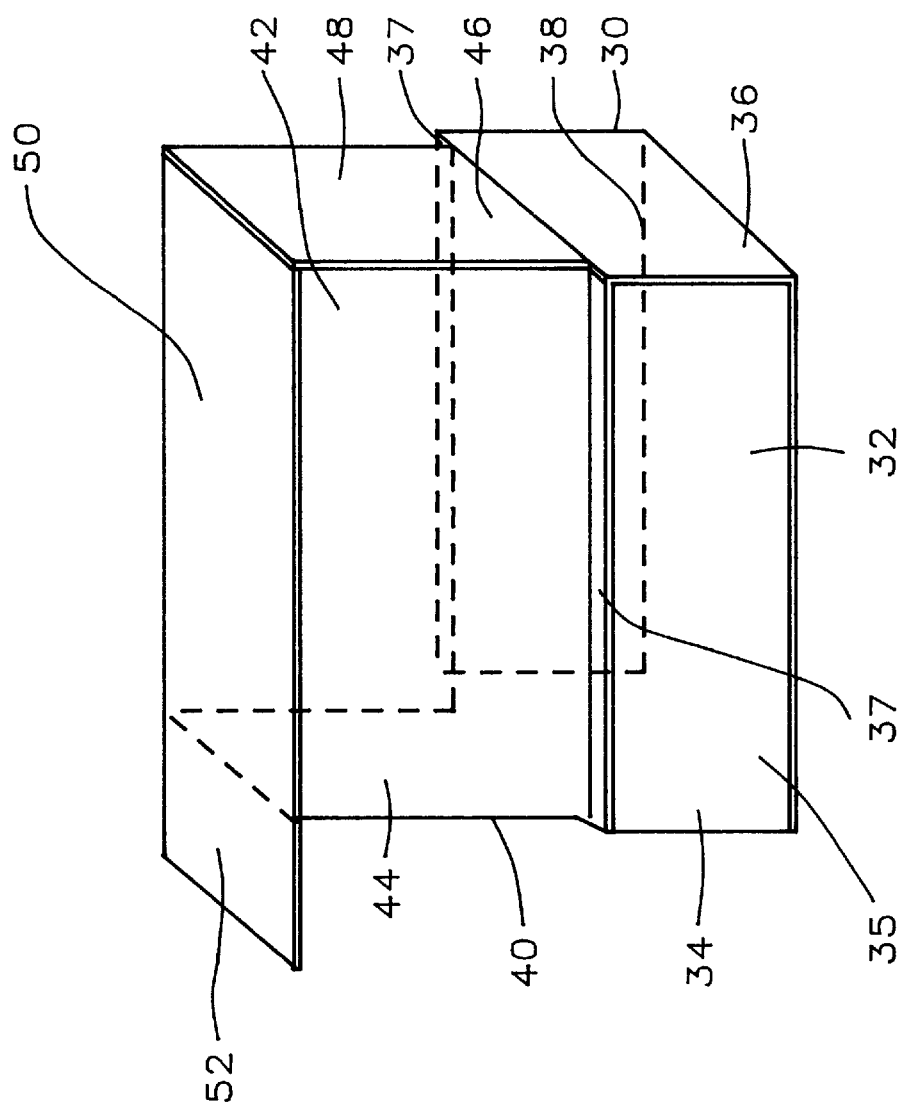
FIG. 2 is perspective view of a semiconductor wafer carrier fork cover of this invention.

Referring to FIG. 2, the semiconductor wafer carrier fork cover lower support unit 30 has one bottom wall 35 and three side walls 32, 36, and 38. A fourth side 34 is open to slide over the base of a semiconductor wafer transfer system. The lower support unit 30 has two top flanges 37 to connect and hold to the upper covering unit 40.

The upper covering unit 40 also, has three side walls 42, 46, and 48. The side walls 42 and 48 attach to the top flanges 37 and the sidewall 46 is integral to the side wall 36 of the lower support unit 30.

The fourth side 44 of the upper covering unit 40 is open to allow the semiconductor wafer carrier forks to enter the wafer carrier fork cover. The top plate 50 of the wafer carrier fork cover is attached to the three sides 42, 46, and 48 of the upper covering unit 40. The top plate 50 is extended 52 over the open end 44 of the upper covering unit 40 to provide additional protection to the semiconductor wafer carrier forks.

Figure 3:
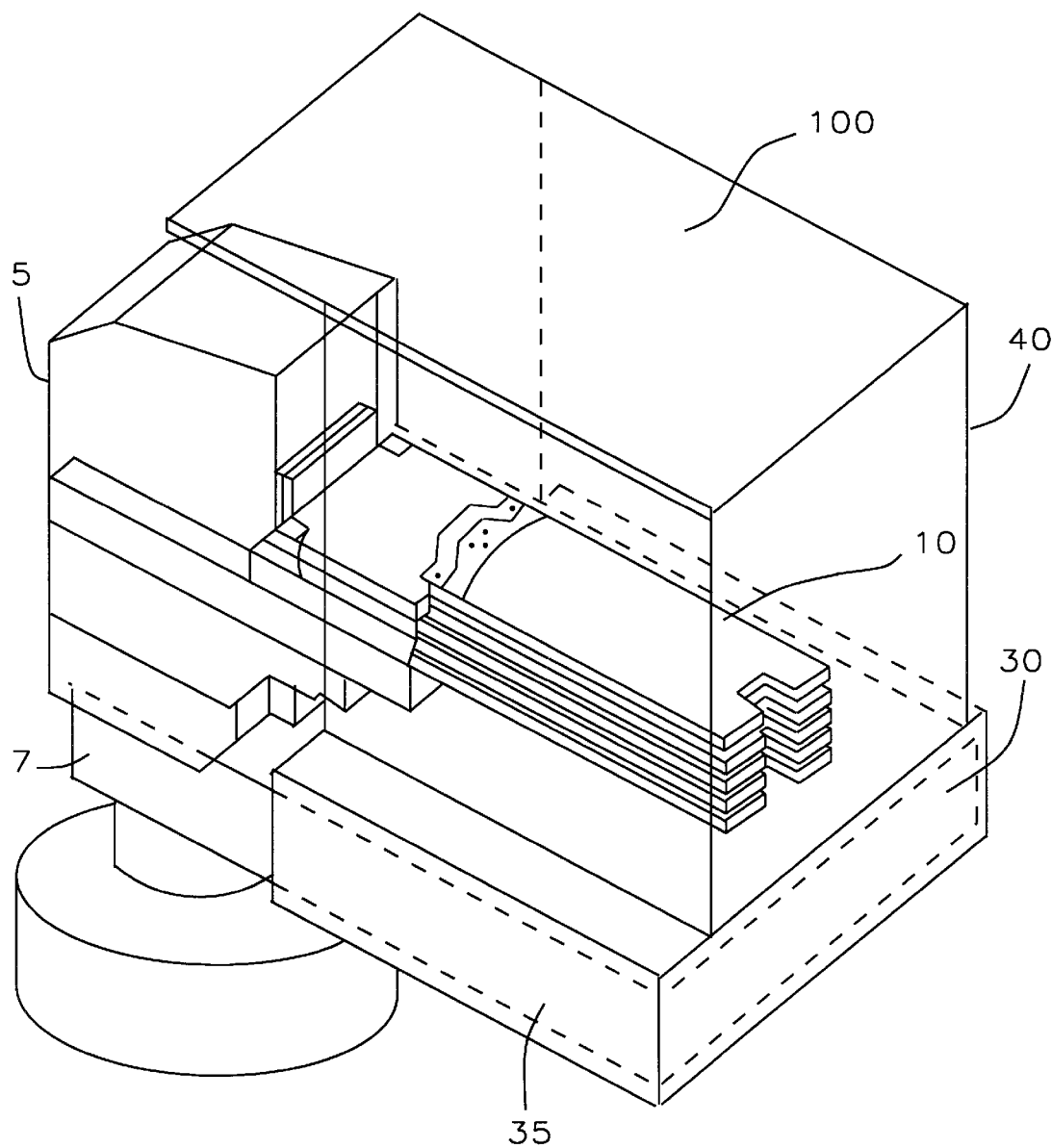
FIG. 3 is perspective view of a wafer transfer system including a semiconductor wafer carrier fork cover.

Referring to FIG. 3, the wafer fork cover 100 is being placed over the robotic semiconductor wafer transfer system 5 during a preventative maintenance procedure. The lower support unit 30 is placed so as to attach to the base 7 of the wafer transfer system 5 and in a position that the base wall 35 will cover the base 7 of the wafer transfer unit 5. The upper covering unit 40 will now shield the semiconductor wafer carrier forks 10 from any components or parts maybe dropped from other subunits of the semiconductor machinery that may be undergoing the preventative maintenance procedure.

While this invention has been particularly shown and described with reference to the preferred embodiments thereof, it will be understood by those skilled in the art that various changes in form and details may be made without departing from the spirit and scope of the invention.

What is claimed is:

1. A semiconductor wafer carrier fork cover to protect a plurality of semiconductor wafer carrier forks of a semiconductor wafer transport device during a preventative maintenance procedure, wherein the preventative maintenance procedure requires disassembly of equipment involved in semiconductor processing for to clean and replace worn and damaged components of said equipment, such that said disassembly requires the removal of parts including screws, washers, and nuts that may be dropped, whereby said semiconductor wafer carrier fork cover will shield the semiconductor wafer carrier forks from said dropped parts, and wherein said semiconductor wafer carrier fork cover comprises:

a) a lower support unit having a size to fit on a base of the semiconductor wafer transport device wherein the lower support unit is rectangular in shape and has three sidewalls, two top flanges, and a first open side such that the base of the semiconductor wafer transport device will pass through the first open side of the lower support unit; and a) an upper covering unit integrally attached to the lower support unit to shield the plurality of semiconductor wafer carrier forks during the preventative maintenance procedure, wherein the upper covering unit is rectangular in shape, and has three side walls connected to the two top flanges to form the integral attachment, a second open side, and a top covering plate that is joined to the three side walls of said upper covering unit and extended beyond a second open side to further protect the semiconductor wafer carrier forks.

2. A semiconductor wafer transfer system to convey semiconductor wafers between a carrying cassette and a wafer boat for process within a heating furnace, comprising:

a) a semiconductor wafer transfer mechanism which includes:
  a plurality of semiconductor wafer carrier forks to support the semiconductor wafers during the conveying between the wafer cassette and the wafer boat, and a robotic control mechanism to move the semiconductor wafer carrier forks in a horizontal rotational motion and a vertical linear motion to convey the semiconductor wafers to the wafer boat; and
b) A semiconductor wafer carrier fork cover to protect a plurality of semiconductor wafer carrier forks of a semiconductor wafer transport device during a preventative maintenance procedure that requires the removal of parts including screws, washers, and nuts that may be dropped, whereby said semiconductor wafer carrier fork cover will shield the semiconductor wafer carrier forks from said dropped parts, and wherein said semiconductor wafer carrier fork cover comprises:
  a lower support unit having a size to fit on a base of the semiconductor wafer transport device, wherein the lower support unit is rectangular in shape and has three sidewalls, two top flanges, and a first open side such that the base of the semiconductor wafer transport device will pass through the first open side of the lower support unit; and
  an upper covering unit integrally attached to the lower support unit to shield the plurality of semiconductor wafer carrier forks during the preventative maintenance procedure, wherein the upper covering unit is rectangular in shape, and has three side walls connected to the two top flanges to form the integral attachment, a second open side, and a top covering plate that is joined to the three side walls of said upper covering unit and extended beyond a second open side to further protect the semiconductor wafer carrier forks.

* * * * *